United States Patent
Gai et al.

(10) Patent No.: US 10,008,696 B2
(45) Date of Patent: Jun. 26, 2018

(54) PACKAGING METHOD, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Renrong Gai, Beijing (CN); Minghua Xuan, Beijing (CN); Yun Qiu, Beijing (CN); Zhiliang Jiang, Beijing (CN); Guanyin Wen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days. days.

(21) Appl. No.: 15/511,297

(22) PCT Filed: Mar. 22, 2016

(86) PCT No.: PCT/CN2016/076990
§ 371 (c)(1),
(2) Date: Mar. 15, 2017

(87) PCT Pub. No.: WO2016/202031
PCT Pub. Date: Dec. 22, 2016

(65) Prior Publication Data
US 2017/0294623 A1 Oct. 12, 2017
US 2018/0138449 A9 May 17, 2018

(30) Foreign Application Priority Data
Jun. 17, 2015 (CN) .......................... 2015 1 0338311

(51) Int. Cl.
*H01L 27/00* (2006.01)
*H01L 51/52* (2006.01)
(Continued)

(52) U.S. Cl.
CPC ...... *H01L 51/5253* (2013.01); *H01L 27/3244* (2013.01); *H01L 51/5246* (2013.01);
(Continued)

(58) Field of Classification Search
CPC .................................................. H01L 27/3244
See application file for complete search history.

(56) References Cited

U.S. PATENT DOCUMENTS

2002/0047963 A1    4/2002   Youn et al.
2010/0227524 A1    9/2010   Jung et al.
2012/0048462 A1*   3/2012   Lee ...................... B32B 37/185
                                                      156/272.8

FOREIGN PATENT DOCUMENTS

CN    1787703 A    6/2006
CN    101937926 A  1/2011
(Continued)

OTHER PUBLICATIONS

China First Office Action, Application No. 201510133811.3, dated Sep. 30, 2016, 20 pps.: with English Translation.
(Continued)

*Primary Examiner* — William Harriston
(74) *Attorney, Agent, or Firm* — Armstrong Teasdale LLP

(57) ABSTRACT

The present disclosure provides a packaging method, a display panel, and a display device. The packaging method includes forming a glass adhesive on a packaging area of an OLED array substrate or on a packaging cover plate, aligning the packaging cover plate with the OLED array substrate, and applying, from a side of the packaging cover plate facing away from the OLED array substrate a laser to the
(Continued)

glass adhesive, to sinter the glass adhesive, wherein the packaging method further includes forming a barrier layer on the packaging cover plate, the barrier layer being configured to block the laser from irradiating an OLED device on the OLED array substrate when the laser irradiates the glass adhesive.

20 Claims, 3 Drawing Sheets

(51) Int. Cl.
*H01L 51/56* (2006.01)
*H01L 27/32* (2006.01)

(52) U.S. Cl.
CPC ........ *H01L 51/56* (2013.01); *H01L 2251/301* (2013.01); *H01L 2251/558* (2013.01)

(56) References Cited

FOREIGN PATENT DOCUMENTS

| CN | 102270645 A | 12/2011 |
|----|-------------|---------|
| CN | 103426903 A | 12/2013 |
| CN | 105098092 A | 11/2015 |
| JP | 2000150145 A | 5/2000 |
| JP | 2001319776 A | 11/2001 |
| JP | 2004085769 A | 3/2004 |

OTHER PUBLICATIONS

China Second Office Action, Application No. 201510133811.3, dated Mar. 14, 2017, 19 pps.: with English Translation.
PCT (CN) Written Opinion, Application No. PCT/CN2016/076990, dated May 27, 2016, 9 pps.: with English Translation.
PCT (CN) International Search Report, Application No. PCT/CN2016/076990, dated May 27, 2016, 8pps.: with English Translation.

* cited by examiner

PACKAGING METHOD, DISPLAY PANEL AND DISPLAY DEVICE

CROSS REFERENCE TO RELATED APPLICATIONS

This application is a National Stage Entry of PCT/CN2016/076990 filed Mar. 22, 2016, which claims the benefit and priority of Chinese Patent Application No. 201510338311.3 filed on Jun. 17, 2015, the disclosures of which are incorporated by reference herein in their entirety as a part of the present application.

BACKGROUND

Exemplary embodiments of the present disclosure relate to a packaging method, a display panel, and a display device.

An Organic Light Emitting Diode (OLED) display panel has the advantages of active light emission, high brightness, high contrast, ultrathin thickness, low power consumption, large view angle, wide operating temperature range and so on, and thus is a new-type advanced flat panel display device widely used.

An existing OLED device has organic layer materials extremely sensitive to moisture and oxygen, which may greatly reduce the service life of the OLED device. To solve this problem, at present, mainly a glass adhesive packaging process is adopted to isolate OLED organic layer materials from the environment. Specifically, first of all, a glass adhesive is formed at an edge of a packaging cover plate by way of screen printing, then the glass adhesive is prebaked, and then the glass adhesive is heated until it is melted and sintered by way of laser irradiation. In this way, the packaging cover plate and an array substrate are adhered together.

However, in the glass adhesive packaging process, when laser irradiation is used to sinter the glass adhesive, the laser is likely to irradiate a cathode layer of the array substrate and cause thermal damage to film layers (for example, planarization passivation layer) under the cathode layer and to neighboring organic light emitting layers, which may cause a failure of light emission of the OLED device thereon. Particularly for a narrow frame product, a distance between the glass adhesive thereon and the cathode layer is further reduced, thereby further increasing a possibility of a laser spot falling on the cathode layer.

BRIEF DESCRIPTION

The present disclosure aims at providing a packaging method, a display panel, and a display device to prevent laser from causing thermal damage to an OLED device on an array substrate.

A first aspect of the present disclosure provides a packaging method, which includes forming a glass adhesive on a packaging area of an OLED array substrate or on a packaging cover plate, aligning the packaging cover plate with the OLED array substrate, and applying, from a side of the packaging cover plate facing away from the OLED array substrate, a laser to the glass adhesive, to sinter the glass adhesive. The packaging method further includes forming a barrier layer on the packaging cover plate, the barrier layer being configured to block the laser from irradiating an OLED device on the OLED array substrate when the laser irradiates on the glass adhesive.

According to an embodiment of the present disclosure, the barrier layer is formed at a side of the packaging cover plate facing away from the OLED array substrate.

According to an embodiment of the present disclosure, a display area of the OLED array substrate is provided with a first electrode layer, an organic light emitting layer and a second electrode layer in sequence, and the first electrode layer further extends to an area between the display area of the OLED array substrate and the packaging area.

After the packaging cover plate is aligned with the OLED array substrate, an edge of the first electrode layer is within a projection of the barrier layer on the OLED array substrate.

According to an embodiment of the present disclosure, the first electrode layer is a cathode layer.

According to an embodiment of the present disclosure, a pattern formed by the barrier layer on the packaging cover plate is ring-shaped or plane-shaped.

According to an embodiment of the present disclosure, the barrier layer has a plurality of layers, and adjacent two layers of the barrier layer are formed by different materials.

According to an embodiment of the present disclosure, the materials of the barrier layer include at least one of aluminum and copper.

According to an embodiment of the present disclosure, each layer of the barrier layer has a thickness in a range from about 200 nm-300 nm.

A second aspect of the present disclosure, further provides a display panel, which includes an OLED array substrate and a packaging cover plate arranged oppositely. A glass adhesive is provided between the OLED array substrate and the packaging cover plate. A sealing structure is formed between the OLED array substrate and the packaging cover plate by applying a laser to the glass adhesive. The packaging cover plate is provided with a barrier layer, which is configured to block the laser from irradiating an OLED device of the OLED array substrate when the laser irradiates the glass adhesive.

According to an embodiment of the present disclosure, the barrier layer is formed at a side of the packaging cover plate facing away from the OLED array substrate.

According to an embodiment of the present disclosure, a display area of the OLED array substrate is provided with a first electrode layer, an organic light emitting layer and a second electrode layer in sequence, and the first electrode layer further extends to an area between the display area of the OLED array substrate and the packaging area.

An edge of the first electrode layer is within a projection of the barrier layer on the OLED array substrate.

According to an embodiment of the present disclosure, the first electrode layer is a cathode layer.

According to an embodiment of the present disclosure, a pattern formed by the barrier layer on the packaging cover plate is ring-shaped or plane-shaped.

According to an embodiment of the present disclosure, the barrier layer has a plurality of layers, and adjacent two layers of the barrier layer are formed by different materials.

According to an embodiment of the present disclosure, the materials of the barrier layer include at least one of aluminum and copper.

According to an embodiment of the present disclosure, each layer of the barrier layer has a thickness in a range from about 200 nm-300 nm.

A third aspect of the present disclosure, further provides a display device, which includes the display panel.

BRIEF DESCRIPTION OF THE DRAWINGS

To describe the technical solutions of the embodiments of the present disclosure more clearly, the accompanying drawings for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by those of ordinary skills in the art based on the embodiments of the present disclosure without creative efforts shall fall within the protection scope of the present disclosure.

In the description of the present disclosure, it is to be noted that the orientations or positions represented by the terms of "up", "down", "top", "bottom" and the like are based on the accompanying figures, they are merely for ease of a description of the present disclosure and a simplified description instead of being intended to indicate or imply the device or element to have a special orientation or to be configured and operated in a special orientation. Thus, they cannot be understood as limitation of the present disclosure.

In addition, in the present disclosure, terms "first", "second" and "third" are merely for description purposes, and are not construed as indicating or implying relative importance. Unless otherwise explicitly stated, the term "a plurality of" means two or more than two.

An embodiment of the present disclosure, provides a packaging method, which includes forming a glass adhesive on a packaging area of an OLED array substrate or on a packaging cover plate, aligning the packaging cover plate with the OLED array substrate, and applying, from a side of the packaging cover plate facing away from the OLED array substrate, a laser to the glass adhesive, so as to melt and sinter the glass adhesive. The packaging method further includes forming a barrier layer on the packaging cover plate, which is configured to block the laser from irradiating on an OLED device of the OLED array substrate when the laser irradiates the glass adhesive.

According to the packaging method of the embodiments of the present disclosure, by forming a barrier layer on the packaging cover plate, the barrier layer may block a laser spot from falling on an OLED device of the OLED array substrate when the laser irradiates the glass adhesive. Thereby, the OLED device may be prevented from a thermal damage caused by the laser.

Figure 1:
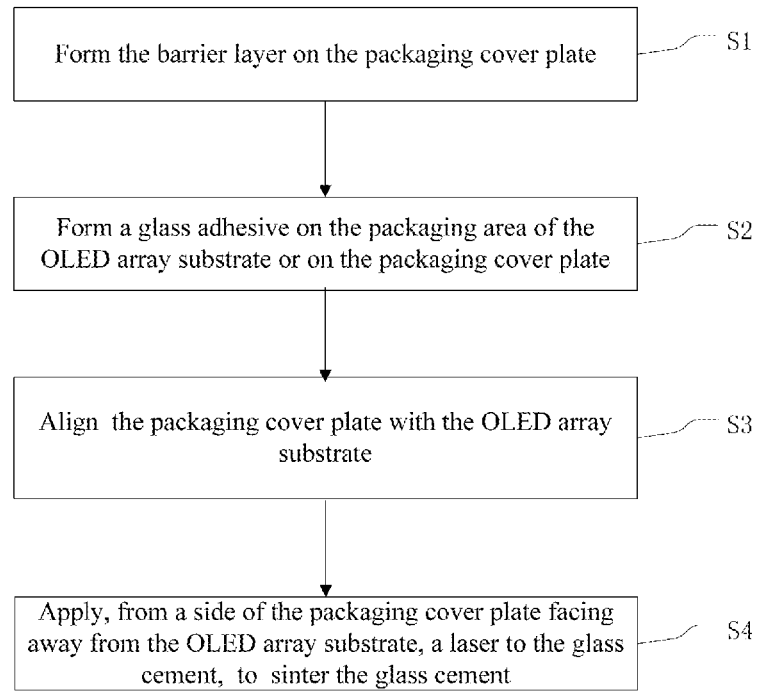
FIG. 1 is a flowchart of a packaging method according to an embodiment of the present disclosure.

FIG. 1 is a flowchart of a packaging method according to an embodiment of the present disclosure. Referring to FIG. 1, the packaging method includes the following steps:

S1: forming a barrier layer on the packaging cover plate;

S2: forming a glass adhesive on the packaging area of the OLED array substrate or on the packaging cover plate;

S3: aligning the packaging cover plate with the OLED array substrate; and

S4: applying, from a side of the packaging cover plate facing away from the OLED array substrate, a laser to the glass adhesive, to sinter the glass adhesive.

In the present disclosure, the barrier layer is configured to block the laser from irradiating the OLED device on the OLED array substrate during packaging. Therefore, in the packaging process, a part of the laser may irradiate the barrier layer so that heat is generated on the barrier layer. To avoid the barrier layer touching with the OLED device on the OLED array substrate and to facilitate heat dissipation for the barrier layer, the barrier layer may be formed on a side of the packaging cover plate facing away from the OLED array substrate.

Figure 2:
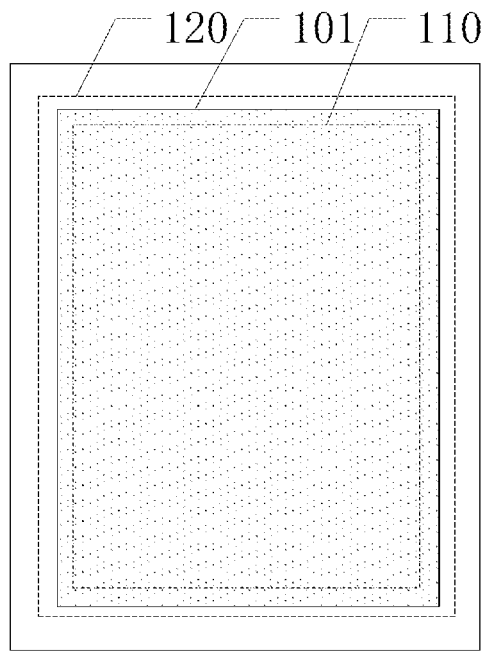
FIG. 2 is a schematic structural diagram of an OLED array substrate according to an embodiment of the present disclosure.

For the OLED array substrate, the OLED device thereon includes a first electrode layer, an organic light emitting layer, and a second electrode layer arranged on a display area in sequence. The first electrode layer may be a cathode layer, and the second electrode layer may be an anode layer. For the first electrode layer 101, as shown in FIG. 2, the first electrode layer 101 is not only arranged in the display area (the area within a dashed line box 110), but also extends to an area between the display area and the packaging area (the area beyond a dashed line box 120). To avoid laser irradiating the first electrode layer 101 in the packaging process, the barrier layer may be determined according to a size and a shape of the first electrode layer. For example, after the packaging cover plate is aligned with the OLED array substrate, an edge of the first electrode layer 101 is within a projection of the barrier layer on the OLED array substrate, and the glass adhesive is beyond the projection of the barrier layer on the OLED array substrate.

Figure 3:
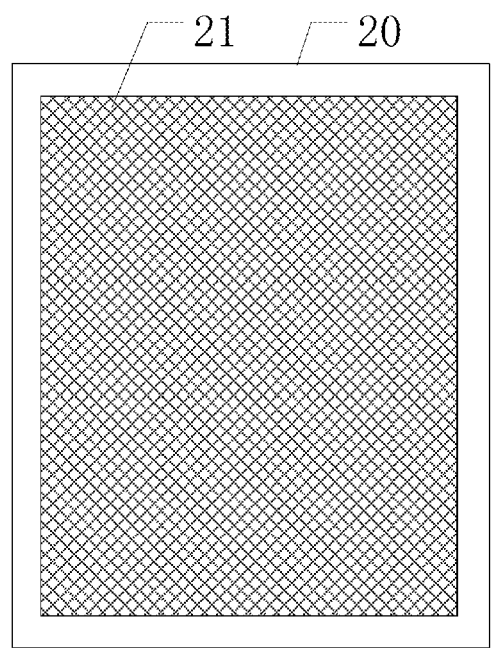
FIG. 3 is a schematic structural diagram of a packaging cover plate according to an embodiment of the present disclosure.
Figure 4:
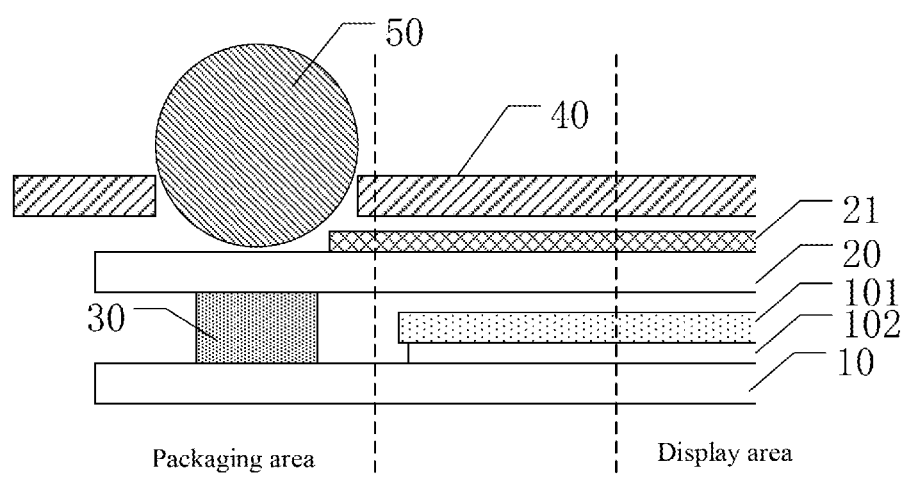
FIG. 4 is a schematic local structural diagram after the packaging cover plate as shown in FIG. 3 is aligned with an OLED array substrate.

For example, as shown in FIG. 3, the shape of the barrier layer on the packaging cover plate may be a plane-shaped structure. After the packaging cover plate is aligned with the OLED array substrate, as shown in FIG. 4, the first electrode layer 101 on the OLED array substrate 10 is completely within the projection of the barrier layer 21 on the OLED array substrate 10, and a sealant 30 is beyond the projection of the barrier layer 21 on the OLED array substrate 10. After laser 50 transmits through a light transmittance area on a laser mask 40, the laser may be further blocked by the barrier layer, so that a laser spot is prevented from falling on the first electrode layer 101, thereby preventing the laser spot from causing a thermal damage to a planarization passivation layer (PLN layer) 102 thereunder and to the organic light emitting layer within the display area. Furthermore, the laser spot may be effectively prevented from causing damage to the OLED device on the OLED array substrate even though the light transmittance area on the laser mask 40 is larger in size.

Figure 5:
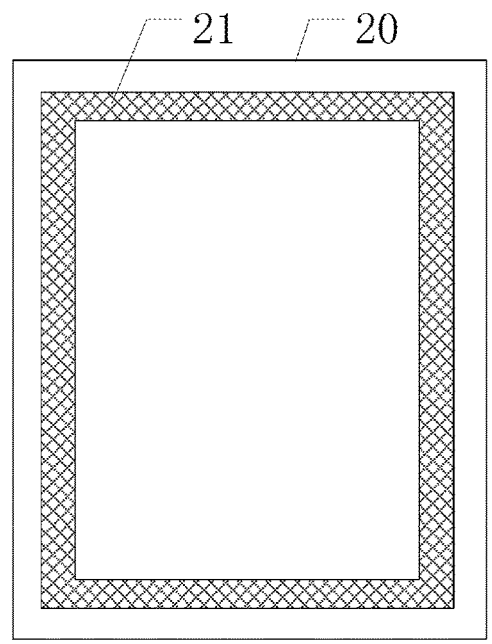
FIG. 5 is a schematic structural diagram of a packaging cover plate according to another embodiment of the present disclosure.
Figure 6:
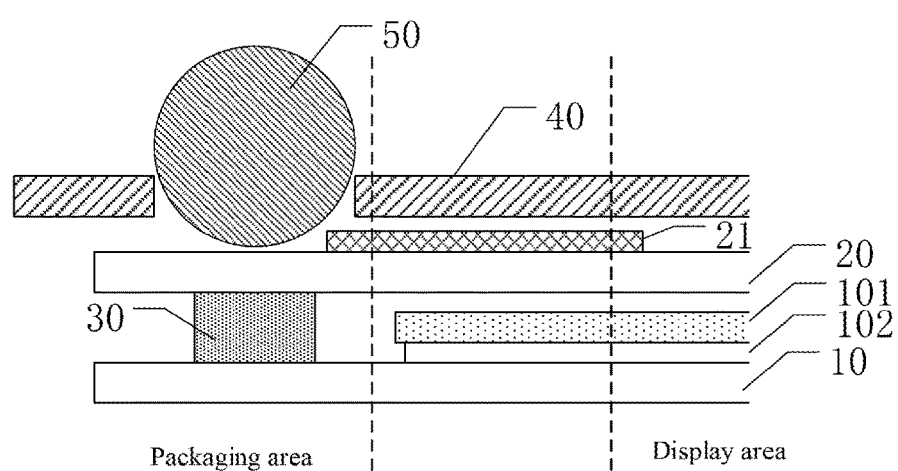
FIG. 6 is a schematic local structural diagram after the packaging cover plate as shown in FIG. 5 is aligned with an OLED array substrate.

In addition, in the process of using the laser mask for laser irradiation, the laser spot may only likely fall on an edge part of the first electrode layer. Therefore, the barrier layer 21 on the packaging cover plate 20 may be ring-shaped, as shown in FIG. 5. After the packaging cover plate is aligned with the OLED array substrate, as shown in FIG. 6, the projection of the packaging cover plate on the array substrate is also ring-shaped, so that the edge part of the first electrode layer 101 is blocked, and other parts of the first electrode layer 101 are blocked by the laser mask 40.

In the present disclosure, the barrier layer may be made from any opaque material. According to an embodiment of the present disclosure, materials having higher melting points and better light reflecting characteristics such as aluminum and copper may be used so as to reduce aggregation of heat on the barrier layer.

Figure 7:
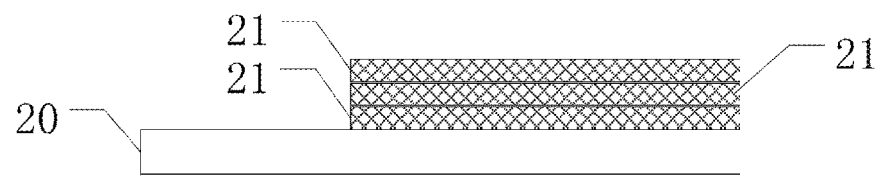
FIG. 7 is a schematic structural diagram of a packaging cover plate according to still another embodiment of the present disclosure.

According to an embodiment of the present disclosure, a plurality of layers of the barrier layer arranged in stack may be formed on the packaging cover plate. For example, three layers of the barrier layer 21 arranged in stacks may be formed as shown in FIG. 7. According to an embodiment of the present disclosure, in the plurality of layers of the barrier layer, adjacent two layers of the barrier layer are formed by different materials. For example, aluminum and copper may be alternately fabricated on the packaging cover plate via chemical vapor deposition or vacuum evaporation, so that a plurality of layers of the barrier layer having alternate high and low refractive indexes may be obtained and a high refractive index may be implemented at a target wavelength (namely, laser wavelength) to further reduce aggregation of heat on the barrier layer. Furthermore, for the plurality of layers of the barrier layer formed, the refractive index of laser increases with increasing number of layers of the barrier layer, also laser loss and absorption in the plurality of layers of the barrier layer increase with increasing number of layers of the barrier layer. Each layer of the barrier layer has a thickness in a range from about 200 nm-300 nm, for example, 230 nm, 250 nm, 280 nm, etc.

According to the packaging method of the embodiments of the present disclosure, by forming a barrier layer on the packaging cover plate, the barrier layer may block a laser spot from falling on an OLED device of the OLED array substrate when the laser irradiates the glass adhesive. Thereby, the OLED device is prevented from a thermal damage caused by the laser. Furthermore, through the above mentioned way, a distance between the glass adhesive and a cathode layer may be reduced, which facilitates a narrow frame design without replacing laser equipment and a laser mask, thereby avoiding cost increase caused by equipment replacement.

An embodiment of the present disclosure, further provides a display panel, which includes an OLED array substrate and a packaging cover plate arranged oppositely. A glass adhesive is provided between the OLED array substrate and the packaging cover plate. A sealing structure is formed between the OLED array substrate and the packaging cover plate by applying a laser to the glass adhesive. The packaging cover plate is provided with a barrier layer, which is configured to block the laser from irradiating an OLED device of the OLED array substrate when the laser irradiates the glass adhesive.

According to an embodiment of the present disclosure, the barrier layer is formed at a side of the packaging cover plate facing away from the array substrate.

According to an embodiment of the present disclosure, a display area of the OLED array substrate is provided with a first electrode layer, an organic light emitting layer and a second electrode layer in sequence. The first electrode layer further extends to an area between the display area of the OLED array substrate and the packaging area. An edge of the first electrode layer is within a projection of the barrier layer on the OLED array substrate.

According to an embodiment of the present disclosure, a pattern formed by the barrier layer on the packaging cover plate may be ring-shaped or plane-shaped.

According to an embodiment of the present disclosure, in the display panel, the barrier layer may be made from any opaque material. In another embodiment of the present disclosure, materials having better light reflecting characteristics such as aluminum and copper may be used so as to reduce aggregation of heat on the barrier layer.

According to an embodiment of the present disclosure, the barrier layer on the packaging cover plate may have a plurality of layers arranged in stack, and adjacent two layers of the barrier layer are formed by different materials. For example, aluminum and copper may be alternately fabricated on the packaging cover plate via chemical vapor deposition or vacuum evaporation, so that a plurality of layers of the barrier layer may be obtained. Each layer of the barrier layer has a thickness in a range from about 200 nm-300 nm, for example, 230 nm, 250 nm, 280 nm, etc.

An embodiment of the present disclosure, further provides a display device which includes the foregoing display panel. The display device according to the embodiments of the present disclosure may be any product or component having a display function, such as a notebook computer display screen, a display, a TV set, a digital photo frame, a mobile phone, a tablet computer, and so on.

The abovementioned embodiments are merely the embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the scope of protection of the present invention shall be subject to the scope of protection of the claims.

The invention claimed is:
1. A packaging method comprising:
forming a glass adhesive on one of a packaging area of an OLED array substrate and on a packaging cover plate;
aligning the packaging cover plate with the OLED array substrate; and
applying, from a side of the packaging cover plate facing away from the OLED array substrate, a laser transmitting through a light transmittance area of a mask to the glass adhesive to sinter the glass adhesive, wherein the packaging method further comprises:
forming a barrier layer on the packaging cover plate, wherein a projection of the barrier layer is within a portion of the light transmittance area that does not overlap with the glass adhesive, and wherein the barrier layer is configured to block the laser from irradiating an OLED device on the OLED array substrate when the laser irradiates the glass adhesive.

2. The packaging method according to claim 1, wherein the barrier layer is formed at a side of the packaging cover plate facing away from the OLED array substrate.

3. The packaging method according to claim 1, wherein a display area of the OLED array substrate is provided with a first electrode layer, an organic light emitting layer, and a second electrode layer in sequence, wherein the first electrode layer further extends to an area between the display area of the OLED array substrate and the packaging area, and wherein after the packaging cover plate is aligned with the OLED array substrate, an edge of the first electrode layer is within a projection of the barrier layer on the OLED array substrate.

4. The packaging method according to claim 3, wherein the first electrode layer is a cathode layer.

5. The packaging method according to claim 1, wherein a pattern formed by the barrier layer on the packaging cover plate is one of ring-shaped and plane-shaped.

6. The packaging method according to claim 1, wherein the barrier layer has a plurality of layers, and wherein two adjacent layers of the barrier layer are formed by different materials.

7. The packaging method according to claim 6, wherein the materials of the barrier layer comprise at least one of aluminum and copper.

8. The packaging method according to claim 6, wherein each layer of the barrier layer has a thickness in a range from about 200 nm~300 nm.

9. A display panel, comprising:
    an OLED array substrate and a packaging cover plate arranged oppositely;
    a glass adhesive provided between the OLED array substrate and the packaging cover plate; and
    a sealing structure formed between the OLED array substrate and the packaging cover plate by applying a laser transmitting through a light transmittance area of a mask to the glass adhesive, wherein the packaging cover plate is provided with a barrier layer configured to block the laser from irradiating an OLED device on the OLED array substrate when the laser irradiates the glass adhesive, and wherein a projection of the barrier layer is within a portion of the light transmittance area that does not overlap with the silicon adhesive.

10. The display panel according to claim 9, wherein the barrier layer is formed at a side of the packaging cover plate facing away from the OLED array substrate.

11. A display device comprising the display panel according to claim 10.

12. The display panel according to claim 9, wherein a display area of the OLED array substrate is provided with a first electrode layer, an organic light emitting layer, and a second electrode layer in sequence, wherein the first electrode layer further extends to an area between the display area of the OLED array substrate and the packaging area, and wherein an edge of the first electrode layer is within a projection of the barrier layer on the OLED array substrate.

13. The display panel according to claim 12, wherein the first electrode layer is a cathode layer.

14. A display device comprising the display panel according to claim 13.

15. A display device comprising the display panel according to claim 12.

16. The display panel according to claim 9, wherein a pattern formed by the barrier layer on the packaging cover plate is one of ring-shaped and plane-shaped.

17. The display panel according to claim 9, wherein the barrier layer has a plurality of layers, and wherein two adjacent layers of the barrier layer are formed by different materials.

18. The display panel according to claim 17, wherein the materials of the barrier layer comprise at least one of aluminum and copper.

19. The display panel according to claim 17, wherein each layer of the barrier layer has a thickness in a range from about 200 nm~300 nm.

20. A display device, comprising the display panel according to claim 9.

* * * * *

UNITED STATES PATENT AND TRADEMARK OFFICE
CERTIFICATE OF CORRECTION

PATENT NO. : 10,008,696 B2
APPLICATION NO. : 15/511297
DATED : June 26, 2018
INVENTOR(S) : Renrong Gai et al.

Page 1 of 1

It is certified that error appears in the above-identified patent and that said Letters Patent is hereby corrected as shown below:

In Specification

Column 2, Line 26, delete "200 nm-300 nm" and insert therefor -- 200nm~300nm --.

Column 2, Line 62, delete "200 nm-300 nm" and insert therefor -- 200nm~300nm --.

Column 5, Line 32, delete "200 nm-300 nm" and insert therefor -- 200nm~300nm --.

Column 6, Lines 18-19, delete "200 nm-300 nm" and insert therefor -- 200nm~300nm --.

Signed and Sealed this
Twenty-eighth Day of May, 2019

Andrei Iancu
*Director of the United States Patent and Trademark Office*